United States Patent [19]
Stevie et al.

[11] Patent Number: 6,121,624
[45] Date of Patent: Sep. 19, 2000

[54] METHOD FOR CONTROLLED IMPLANTATION OF ELEMENTS INTO THE SURFACE OR NEAR SURFACE OF A SUBSTRATE

[75] Inventors: Frederick A. Stevie; Ronald F. Roberts, both of Orlando; Mark A. Decker, Winter Park, all of Fla.

[73] Assignee: Lucent Technologies, Inc., Murray Hill, N.J.

[21] Appl. No.: 09/138,741

[22] Filed: Aug. 24, 1998

[51] Int. Cl.$^7$ .................. H01L 21/66; H01L 21/265; H01J 49/04
[52] U.S. Cl. .................. 250/492.21; 250/282; 250/309
[58] Field of Search .................. 250/282, 492.21, 250/309

[56] References Cited

U.S. PATENT DOCUMENTS

| | | | |
|---|---|---|---|
| 5,637,870 | 6/1997 | Tanigaki | 250/282 |
| 5,918,151 | 6/1999 | Tachimori et al. | 250/492.21 |

OTHER PUBLICATIONS

F.A. Stevie, R.G. Wilson, J.M. McKinley, & C.J. Hitzman, "Multiple Element Ion Implants For Metal Contamination Analysis In Semiconductor Technology", *Quantitative Analysis*, pp. 983–986, Sep. 1997.

K. Nakatsu, S. Hatakey AMA, & S. Saito, "Charge Compensation in High–Resistivity Insulator Analysis with Electron Bombardment by CAMECA ims 4f", *Secondary Ion Mass Spectrometry SIMS XI*, Proceedings of the Eleventh International Conference on Secondary Ion Mass Spectrometry, Sep. 7–12$^{th}$, 1997, John Wiley & Sons.

F.A. Stevie, "Secondary Ion Mass Spectrometry–First Microelectronics, Now the Rest of the World", *Surface And Interface Analysis*, vol. 18, pp. 81–86, (1992).

C.W. Magee & W.L. Harrington, "Depth Profiling of Sodium in SiO$_2$ Films by Secondary Ion Mass Spectrometry", *Appl. Phys. Lett.*, vol. 33(2), Jul. 15, 1978.

F.A. Stevie, V.V.S. Rana, A..S. Harrus, T.H. Briggs, P. Skeath, "Summary Abstract: High Sputter Rate Secondary Ion Mass Spectrometry Analysis of Insulators Used in Microelectronica and Lightwave Applications", *J. Vac. Sci. Technol.. A*, vol. 6(3), May/Jun. 1988, pp. 2082–2084.

Charles Evans & Associates, "The CEA Online Tutorial" including sections on SIMS Theory and SIMS Instrumentation, http://www.cea.com/tutorial.htm, *Copyright 1995*.

Case Technology Inc., "The Ion Implanter", http://www.casetechnology.com/implanter/intro.html, including "The Ion Implanter", http://www.casetechnology.com/implanter/implanter.html,. "The Ion Source", http://www.casetechnology.com/implanter/source.html, "The Ion Beam", http://www.casetechnology.com/implanter/beam.html, "The Glossary", and http://www.casetechnology.com/implanter/glossary.html updated May 1, 1998.

*Primary Examiner*—Jack Berman
*Attorney, Agent, or Firm*—Alston & Bird LLP

[57] ABSTRACT

A method for introducing a known concentration of at least one species of ions into the surface or near surface of a substrate can be employed as a calibration technique prior to subsequent surface or near surface measurement. The method involves the introduction of a removable layer onto the surface followed by ion implantation which is performed to provide a known concentration of implanted ion at the interface between the removable layer and the surface. Subsequent to removal of the removable layer, the surface can be subjected to determination of elemental concentrations at the surface or near surface levels by techniques such as total reflection x-ray fluorescence or secondary ion mass spectrometry.

14 Claims, 1 Drawing Sheet

METHOD FOR CONTROLLED IMPLANTATION OF ELEMENTS INTO THE SURFACE OR NEAR SURFACE OF A SUBSTRATE

FIELD OF THE INVENTION

The invention relates to a technique for the implantation of one or more ions so as to provide a known concentration of the ion(s) at the surface or near surface of a substrate material. This technique allows for the more advantageous preparation or calibration of the material for subsequent surface or near surface elemental measurements.

BACKGROUND OF THE INVENTION

Recent advances in semiconductor technology have made the determination of the concentration of an element at the surface, or near surface, e.g., within a few tens of angstroms of the surface, a significant issue. For example, development of ultra-shallow devices requires a quantitative method for providing information starting at the surface of the material. Moreover, the concentration of desired elements, e.g., dopants, and undesired elements, e.g., contaminants, are of importance.

Unfortunately, elemental measurement at surface or near surface conditions is complicated by the lack of reliable reference standards for these measurements.

In the past, the art has employed certain chemical preparations in an attempt to facilitate the determination of the concentration at the surface of the material. One example of such a technique has involved dissolving a powder in a liquid and applying the solution over the surface to be tested in such a manner so as to leave a residue of the powder on the surface to be tested. However, these chemical preparations have proven less than satisfactory. For example, such techniques are difficult to reproduce and non-uniform in character, thus, they have not been effective in providing a consistent result.

Thus the need still exists for a method of preparing, and in particular calibrating, a surface which will facilitate surface or near surface elemental measurements thereof

SUMMARY OF THE INVENTION

The present invention is based at least in part on the surprising discovery that the introduction of a removable layer followed by ion implantation is capable of providing a surface or near surface of known concentration. This method can be effectively used for calibration prior to surface or near surface measurement.

In one aspect, the present invention relates to a method for introducing a known concentration of implanted ion at the surface or near surface to be tested. This method for introducing a known concentration of an implanted element at the to surface or near surface of a substrate includes the steps of:

(a) introducing a removable layer onto the surface of a substrate to provide a composite;

(b) implanting one or more ions into the resulting composite so as to provide a known concentration of implanted ion at the interface between the removable layer and the surface; and (c) removing the removable layer from the substrate.

In another aspect, the present invention relates to a method for determining the concentration of one or more elements at the surface or near surface of the material in which a known ion concentration is introduced at the surface or near surface of the material as a calibration technique. The subsequent determination of elemental concentrations at surface or near surface levels by art recognized techniques, e.g., total reflection x-ray fluorescence (TXRF) or secondary ion mass spectrometry (SIMS). For example, such a method comprises:

(i) preparing a substrate by introducing a known concentration of at least one element at the surface or near surface of a substrate, and (ii) performing a measurement technique to determine the concentration of one or more elements at the surface or near surface of the substrate.

The method can be employed in the production of integrated circuits. In particular, the method can be used to insure that wafers are suitable for use in manufacturing integrated circuits. These and other aspects will be discussed in more detail below.

DETAILED DESCRIPTION OF THE PREFERRED EMBODIMENT OF THE INVENTION

Figure 1A:
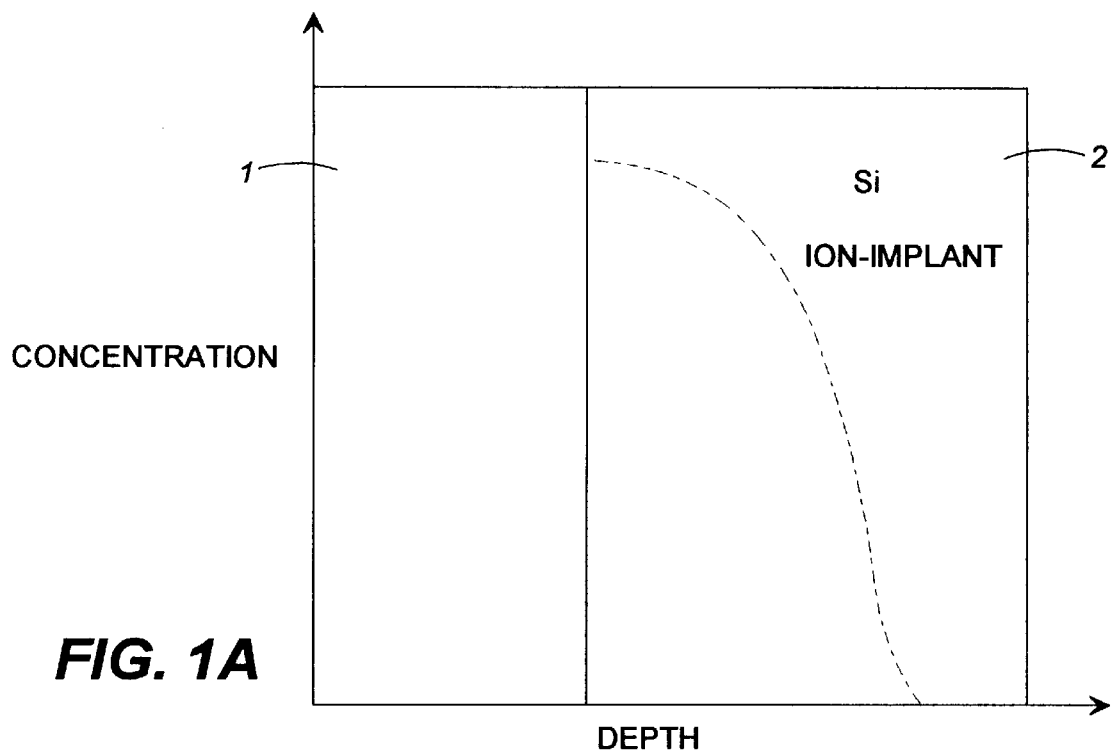
FIGS. 1$a$ and 1$b$ schematically illustrate the inventive method for introducing a known concentration of ions into the surface/near surface of a substrate.

As discussed above, the inventive method relates to a method for introducing a known concentration of implanted ion at the surface or near surface of a substrate. As such, the method can be employed as a calibration technique that allows for the surface or near surface determination of elemental concentration by art recognized techniques such as TXRF or SIMS.

By "near surface," it is referring to the area, typically within a few tens of angstroms of the surface that can be successfully analyzed by one or more recognized technique such as TXRF or SIMS.

The inventive method comprises introducing a removable layer onto the surface of the substrate to be tested prior to implanting ions into the substrate. The use of this layer allows for the controlled placement of a known concentration of ions during the subsequent implantation process. Accordingly, following the subsequent removal of the removable layer, a known concentration of implanted ion remains at the surface or near surface of the original substrate. The substrate can then be more easily subjected to those techniques for determining elemental concentration.

The first step in this method of preparation involves introducing a removable layer onto the surface that is to be tested. The nature of this layer is not critical except to the extent that it (1) is capable of being implanted with one or more ions and (2) can be effectively removed from the substrate subsequent to implantation. Accordingly, the removable layer can comprise any material that meets the foregoing requirements.

The present technique can be used with virtually any substrate material in which surface testing or near surface testing of the material is desired. The only requirement for the material is that, as with the case of the removable layer, it can be subjected to ion implantation. Because virtually any material can be implanted with ions, this is not a significant limitation on the scope of materials that can be employed. However, the removable material should not significantly change the original surface of the material either during its introduction or subsequent removal.

One example of an environment where the inventive method can be use is field of microelectronics. In this area, a suitable removable layer can comprise, for example, a silicon oxide or nitride layer on a silicon substrate.

Suitable methods for introducing the removable layer are dependent on the nature of the layer. For example, where the removable layer involves an oxide on a silicon substrate, suitable techniques include both oxide growth and depositions. Such techniques are recognized in the art and need not be described in detail here.

The thickness of the removable layer is dependent largely upon the subsequent ion implantation step. That is, the thickness must be coordinated with the ion implantation step such that a known concentration of the implanted ions at the interface between the removable layer and the surface is known.

To this end, this inventive method can be employed with virtually any elements to be tested. That is, in so far as virtually any ion can be implanted into the surface of the material, there is no limit on the elements that can be tested. As to the ion implantation step, such techniques are also well recognized in the art.

For example, a typical ion implanter uses a high-current accelerator tube and steering and focusing magnets to bombard the surface of the substrate with ions of a particular element. These ions can be implanted into the top layer of the substrate just below the surface. For example, an implanter can have an energy range from 0.5 keV to 50 keV with typical machines used in the manufacture of electronic devices employing beam energies from 2 keV up to 2 MeV.

One example of a suitable machine is discussed on the Internet at http://www.casetechnology.com/implanter/intro.html, and includes a radio frequency (RF), multi cusp ion source that uses a gas delivery system to produce the desired beam species. In this machine, the beam then passes through a pre-acceleration section, known as the source extraction. The bias voltage gives the beam sufficient energy to allow selection of the desired species required for implantation by a 90 deg. dipole analyzing magnet.

The implantation of one or more species of ions can be performed by commercially available apparatus such as those produced by the following manufacturers: Eaton, Varian, Applied Materials, Genus, Ibis Technology Corp., Diamond Semiconductor Group and Superior Design.

It is also recognized that ions can be singly or multiply implanted into samples and in such a manner that the concentration of the implant at various depths within the sample are known. That is, the ability to provide multiple ion implants by techniques which results in the known concentration of ion at various depths within the implant is also well recognized in the art. See, for example, the article entitled "Multiple Element Ion Implants for Metal Contamination Analysis in Semiconductor Technology" by F. A. Stevie et al., *Secondary Ion Mass Spectrometry SIMS XI*, Orlando, Fla., (1997), pp. 983–987, which is incorporated by reference.

Accordingly, those skilled in the art would be readily capable of implanting a desired ion such that the ion concentration at a "depth" corresponding to the interface between a removable layer and the surface to be tested would be both known and relatively uniform over a desired area. To this end, it is preferred that the ion concentration be uniform over relatively uniform for some depth into the material to be tested. While this depth of uniform concentration will vary from material to material, for silicon and semiconductor applications, it typically need not be more than 100 angstroms, preferably 50–100 angstroms.

In addition, the interfacial depth preferably corresponds to the implant peak concentration; however, it need not correspond to this peak concentration as long as the concentration can be known. FIG. 1a illustrates implantation such that implant peak concentration occurs at the interface.

Figure 1B:
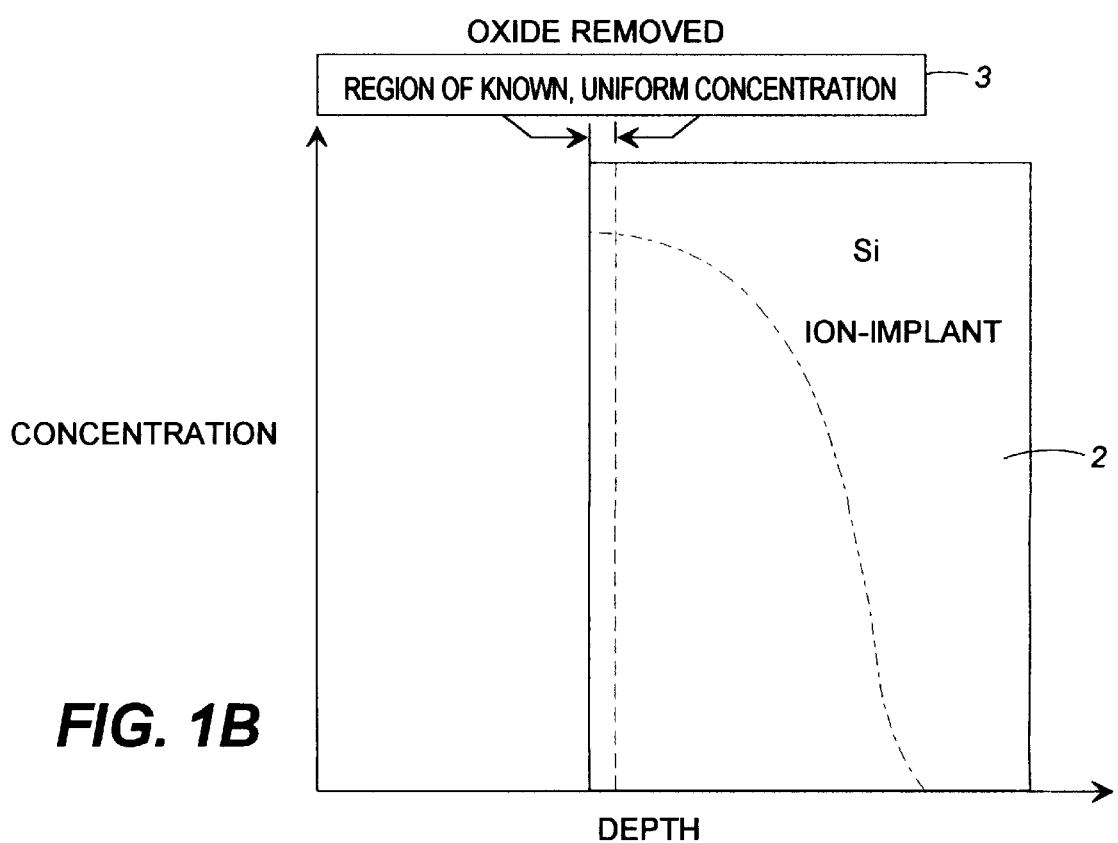

After implantation, the removable layer is removed to leave this surface which now has been implanted with a known concentration of implanted ion. This is shown in FIG. 1b. The method of removal of this layer is not critical and is dependent upon the removable layer employed. For example, where the removable layer is silicon oxide on a silicon base, etching can be employed. Etching is also recognized in the art.

Reference is now made to FIGS. 1a and 1b which illustrate the preparation method according to the present invention. In this regard, the graph of FIG. 1a illustrates the concentration with depth of the ion implant in both the removable layer 1 and the substrate 2 while FIG. 1b illustrates the region of uniform concentration 3 in the surface of substrate 2 subsequent to removal of the removable layer.

Because the resulting product includes a known concentration of implanted ions within a near surface level, e.g., less than about 100 angstroms from the surface of the substrate, the method can be readily employed as a "calibration" technique for subsequent elemental measurement at the surface or near surface of the substrate.

To this end, after introducing the known concentration of implanted ion(s) into the substrate, the surface or near surface elemental measurement of the substrate can be performed. Once again, the particular measurement technique is not critical to the present invention. Preferred examples of known measurement techniques such as total reflection x-ray fluorescence (TXRF) and secondary ion mass spectrometry (SIMS) can be employed.

In TXRF, X-rays from e.g., a tungsten anode or molybdenum tube, impinge the sample surface at a glancing angle, within the critical angle for total external reflectance, and excite the electrons on atoms in the top few monolayers of the sample, causing them to emit photons (fluoresce). The X-ray photons emitted by the surface atoms have energies that are characteristic of the particular element. They are detected by e.g., an Si(Li) energy dispersive spectrometer. Specific examples of suitable instruments include those produced under the TREX tradename by Technos, e.g., TREX 610T and TREX 630T.

A second technique for surface and near surface measurement is SIMS. The SIMS analysis technique is well recognized in the art. In this regard, a good tutorial relating to the SIMS technique can be found on the Internet at http://www.cea.com/tutorial.htm, which is incorporated by reference in its entirety.

As discussed therein, SIMS involves the use of a bombarding primary ion beam onto a sample. Primary ions are implanted and mix with sample atoms to typical depths of 1 to 10 nm depending on the bombarding energy. The bombarding ion produces monatomic and polyatomic neutrals and ions of the sample, resputtered primary ions, as well as electrons and photons. Sputter rates depend on primary beam intensity, sample material, and crystal orientation. Sputter rates in typical SIMS analyses vary between 0.5 and 5 nm/s.

In choosing ion species it should be noted that in so far as SIMS involves the bombardment of the sample with a primary ion beam, e.g., an $O^{2+}$ beam, there are certain limitations regarding the elements that can be detected. That is, in so far as an element, e.g., oxygen is employed as the primary ion beam, the method can not be effectively employed in determining elemental oxygen concentration in the substrate.

The primary ion beam species that are typically employed in SIMS analysis include $Cs^+$, $O^{2+}$, $O^-$, $Ar^+$, and $Ga^+$ at energies between 1 and 30 keV.

SIMS instruments include both static SIMS instruments, e.g., time-of-flight instruments, and dynamic SIMS instruments. Dynamic SIMS instruments in turn primarily employ use two kinds of mass analyzers, magnetic sector analyzers and quadrupole analyzers.

Magnetic sector instruments are common in the field. In these instruments, the ion beam passes through the magnetic field where the particles are acted on by a force at right angles, both to the direction of motion and to the direction of the magnetic field. Modern mass spectrometers use non-normal pole faces for entrance and exit of the ion beam to the magnetic sector. The fringings fields in this configuration compress the ion beam in the vertical direction (in and out of the screen) as it passes through the sector. Fewer ions strike metal surfaces and the ion beam focuses better at the exit slit with non-normal pole faces. The entrance and exit slits can be arranged at ion beam crossovers for the cleanest separation (highest mass resolution) between ions with similar m/z values.

Quadrupole mass analyzers, on the other hand, have been employed in many kinds of analysis. Quadrupole analyzers employ rods that ideally have hyperbolic shapes, but this geometry can be approximated with closely spaced circular rods. In a typical quadrupole spectrometer, the rods are 1 cm in diameter and 20 cm long. Ions enter at a relatively low energy (~25 eV). Alternating and direct voltages on the rods cause the ions to oscillate after entering the quadrupole. For a given set of voltages, ions with a single mass-to-charge ratio undergo stable oscillation and traverse through the rods. All other ions have unstable oscillations and strike the rods. The alternating frequency and the ratio between the alternating and direct voltages remain constant. other ions have unstable oscillations and strike the rods. The alternating frequency and the ratio between the alternating and direct voltages remain constant.

Any art recognized instrument for performing SIMS analysis, e.g., magnetic sector, quadrupole or time of flight instruments, can be employed in this invention.

Examples of suitable magnetic sector devices include those produced by CAMECA, e.g. the CAMECA IMS-3F, IMS-4F, IMS-5F and IMS-6F.

Finally, the invention is not limited to TXRF and SIMS. Suitable techniques for surface and near surface measurements include other mass spectrometric techniques such as Matrix Assisted Laser Desorption Ionization (MALDI); electron beam techniques such as Auger Electron Spectrometry (AES), Scanning Auger Microscopy (SAM), Energy Dispersive X-ray Spectrometry (EDS), Scanning Electron Microscopy (SEM), Field Emission Scanning Electron Microscopy (FE-SEM), X-ray Photoelectron Spectroscopy (XPS), Electron Spectroscopy for Chemical Analysis (ESCA); scanning probe techniques such as Atomic Force Microscopy (AFM), Magnetic Force Microscopy (MFM), Scanning Tunneling Microscopy (STM); and accelerator techniques such as Rutherford Backscattering Spectrometry (RBS), Hydrogen Forward Scattering Spectrometry (HFS), and Particle Induced X-Ray Emission (PIXE). Each of these techniques are recognized in the art.

The use of these analysis methods subsequent to "calibration" by the implantation method of the invention allows for an accurate determination of elemental concentration at surface and near surface levels.

One area in which the method can be employed includes wafer fabrication during the manufacture of integrated circuits. For example, the method can be used to "test" one or more wafers from a lot of wafers. Such testing can be used to ensure that the wafers are suitable for use in manufacturing integrated circuits.

The inventive method is capable of providing a number of significant advantages over prior art calibration techniques. First, it is both quantifiable and reproducible in terms of the ion concentration introduced into the surface of a substrate. Because of this the invention allows for the accurate testing within the near surface area, e.g., the top 30 to 40 angstroms or more, on the surface of the substrate. This is particularly critical in connection with recent advances, e.g., in the area of ultra-shallow devices.

Moreover, it allows more than one element to be implanted and therefore measured in connection with any single sample. Further, it allows for a wide variety of sample materials and sizes to be tested. Finally, it does not add a significant cost to either testing or manufacturing the materials.

While the present invention has been discussed in terms of the use of the calibration method in connection semiconductor electronic devices, it can find usefulness in virtually any environment in which surface and near surface elemental measurements are needed.

Although the present invention has been described in terms of various preferred embodiments, it will be readily apparent that various modifications, substitutions, omissions, changes and the like can be made without departing from the spirit thereof For example, the calibration method can be used in a variety of environments and with a variety of substrates that have not been explicitly discussed herein. For this reason, the scope of the present invention should be limited only by the scope of the following claims including equivalents thereof.

What is claimed is:

1. A method for introducing a known concentration of an implanted element at the to surface or near surface of a substrate comprises:

(a) introducing a removable layer onto the surface of a substrate to provide a composite;

(b) implanting one or more species of ions into the resulting composite so as to provide a known concentration of implanted ion at the interface between the removable layer and the surface; and (c) removing the removable layer from the substrate so as to provide a known concentration of implanted ion at the surface or near surface of the substrate.

2. The method according to claim 1 wherein step (b) comprises implanting at least one species of ion such that the implant peak concentration is at the interface between the removable layer and the substrate.

3. The method according to claim 1 wherein (b) comprises implanting more than one species of ion into the composite.

4. The method according to claim 1 wherein the substrate comprises silicon.

5. The method according to claim 4 wherein the removable layer comprises silicon oxide or silicon nitride.

6. The method according to claim 4 wherein the removable layer is introduced by growth or deposition.

7. The method according to claim 4 wherein the silicon oxide layer is removed by etching.

8. A method for determining the concentration of an element at the surface or near surface of a substrate comprising:

(i) preparing a substrate by introducing a known concentration of at least one element at the surface or near surface of a substrate, said known concentration being introduced by the method according to any one of claims 1–7; and (ii) performing a measurement technique to determine the concentration of one or more elements at the surface or near surface of the substrate.

9. The method according to claim 8 wherein step (ii) involves performing reflection x-ray fluorescence.

10. The method according to claim 8 wherein step (ii) involves performing secondary ion mass spectroscopy.

11. A method for manufacturing integrated circuits including wafer fabrication wherein the improvement comprises determining the concentration of one or more elements at the surface or near surface of at least one wafer from a lot of wafers to be used in the fabrication process, said determination being performed by the method according to claim 8.

12. A method for testing wafers to be used in manufacturing integrated circuits comprising:

(a) selecting at least one wafer from a lot of wafers to be used in making integrated circuits; and (b) determining the concentration of one or more elements of the surface or near surface of the wafer, wherein step (b) comprises (i) introducing a known concentration of at least one element at the surface or near surface of the at least one wafer, said known concentration being introduced by the method according to any one of claims 1–7; and (ii) performing a measurement technique to determine the concentration of one or more elements at the surface or near surface of the substrate.

13. A method for determining the concentration of an element at the surface or near surface of a substrate comprising:

(i) preparing a substrate by implanting a known concentration of at least one ion species at the surface or near surface of a substrate; and (ii) performing a measurement technique to determine the concentration of one or more elements at the surface or near surface of the substrate.

14. A method for testing wafers to be used in the manufacture of integrated circuits comprises:

(i) introducing a known concentration of at least one element at the surface or near surface of a wafer; and (ii) performing a measurement technique to determine the concentration of one or more elements at the surface or near surface of the substrate.

* * * * *